(12) United States Patent
Kikuchi et al.

(10) Patent No.: US 6,893,926 B2
(45) Date of Patent: May 17, 2005

(54) MANUFACTURING METHOD OF SEMICONDUCTOR DEVICE WITH PROTECTION AGAINST ELECTROSTATIC DISCHARGE

(75) Inventors: Shuichi Kikuchi, Oizumi-machi (JP); Masafumi Uehara, Oizumi-machi (JP); Eiji Nishibe, Oizumi-machi (JP); Katsuyoshi Anzai, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/603,083

(22) Filed: Jun. 25, 2003

(65) Prior Publication Data

US 2004/0053471 A1 Mar. 18, 2004

(30) Foreign Application Priority Data

Jun. 27, 2002 (JP) ........................... 2002-188282

(51) Int. Cl.[7] ............................. H01L 21/336
(52) U.S. Cl. .................. 438/286; 438/299; 438/301
(58) Field of Search ................ 438/197, 299, 438/301, 286; 257/409

(56) References Cited

U.S. PATENT DOCUMENTS

| | | | | |
|---|---|---|---|---|
| 5,397,905 A | * | 3/1995 | Otsuki et al. | ................ 257/133 |
| 6,489,653 B2 | * | 12/2002 | Watanabe et al. | ........... 257/343 |
| 6,638,827 B2 | * | 10/2003 | Kikuchi et al. | ............. 438/286 |

* cited by examiner

Primary Examiner—David Zarneke
Assistant Examiner—Scott B. Geyer
(74) Attorney, Agent, or Firm—Morrison & Foerster LLP

(57) ABSTRACT

A withstand voltage against electrostatic discharge of a high voltage MOS transistor is improved. An $N^-$-type drain layer is not formed under an $N^+$-type drain layer, while a $P^+$-type buried layer is formed in a region under the $N^+$-type drain layer. A PN junction of high impurity concentration is formed between the $N^+$-type drain layer and the $P^+$-type buried layer. In other words, a region having low junction breakdown voltage is formed locally. The surge current flows through the PN junction into the silicon substrate before the $N^-$-type drain layer below a gate electrode is thermally damaged. Hence, the ESD withstand voltage is improved.

6 Claims, 11 Drawing Sheets

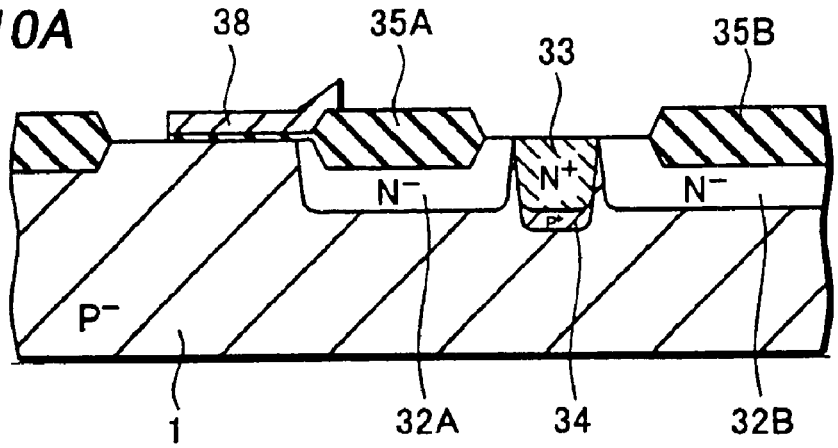
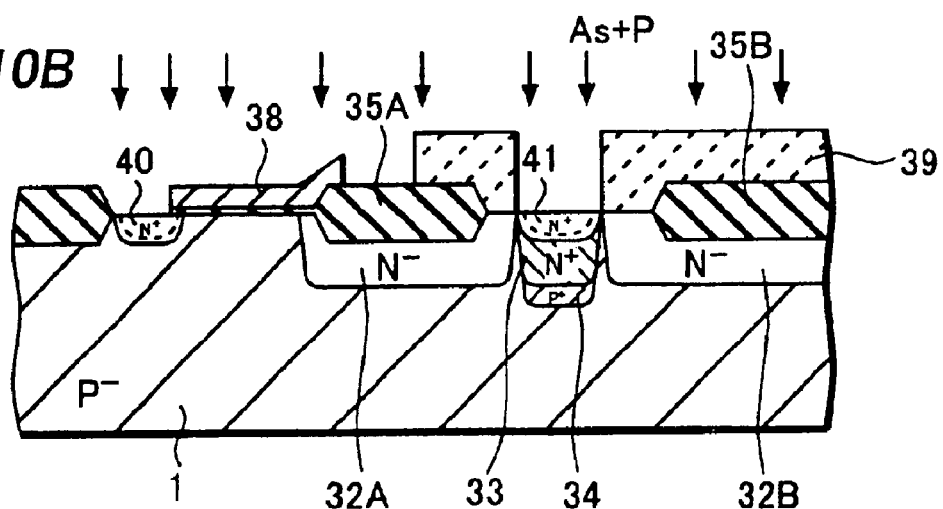
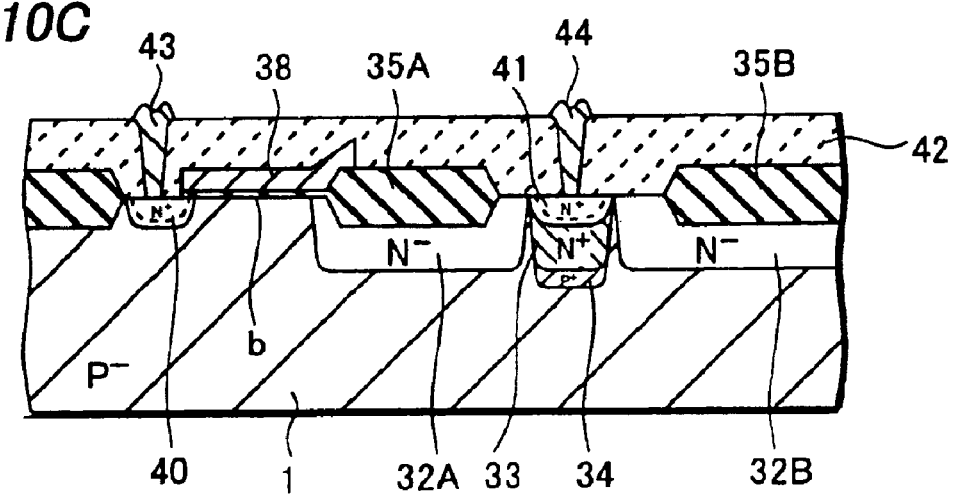

MANUFACTURING METHOD OF SEMICONDUCTOR DEVICE WITH PROTECTION AGAINST ELECTROSTATIC DISCHARGE

BACKGROUND OF THE INVENTION

1. Field of the Invention

This invention relates to a manufacturing method of a semiconductor device, specifically to a manufacturing method of a high voltage MOS transistor incorporated in a semiconductor integrated circuit.

2. Description of the Related Art

The high voltage MOS (metal oxide semiconductor) transistor has a high source-drain withstand voltage (BVDS) or a high gate withstand voltage, and is applied to an LCD driver, an EL driver, a power supply circuit and the like.

FIG. 14 is a cross-sectional view showing a structure of an N-channel type high voltage MOS transistor according to a conventional art. A gate oxide film 101 and a thick field oxide film 102 are formed on a surface of a P-type silicon substrate 100. A gate electrode 103 is formed on the gate oxide 101 and extending onto an adjacent portion of the field oxide film 102. An N$^+$-type source layer 104 is formed in a surface of the silicon substrate 100 adjacent to one end of the gate electrode 103. An N$^+$-type drain layer 105 is formed in a surface of the silicon substrate 100 apart from the other end of the gate electrode 103.

An N$^-$-type drain layer 106 is formed in a part of the surface (offset region) of the silicon substrate 100 between the N$^+$-type drain layer 105 and the other end of the gate electrode 103. The N$^-$-type drain layer 106 is diffused deeper than the N$^+$-type drain layer 105, and extends to the end of the gate electrode 103 through the region under the field oxide film 102.

A high source-drain withstand voltage can be obtained with the high voltage MOS transistor structure described above, since a depletion layer expands into the N$^-$-type drain layer 106 to relax a drain electric field when a high voltage is applied to the drain layer 106. Also the structure is sturdy against destruction of the gate oxide film 101, because the gate electrode 103 extends from the gate oxide film 101 onto the adjacent portion of the field oxide film 102.

However, according to experiments performed by the inventors, the conventional transistor structure described above has a problem of low withstand voltage against electrostatic discharge (hereafter referred to as ESD withstand voltage). For example, the ESD withstand voltage measured by a common ESD damage test based on a human body model (capacitance: 100 pF, resistance: 1.5KΩ) is about 500V, which is not high enough.

SUMMARY OF THE INVENTION

The invention provides a manufacturing method of a semiconductor device. The method includes providing a semiconductor substrate of a first conductivity type, forming a low impurity drain layer of a second conductivity type in the surface of the semiconductor substrate, forming a gate insulation film on the semiconductor substrate, forming a gate electrode on the gate insulation film, and forming a high impurity drain layer of the second conductivity type so as to be adjacent the low impurity drain layer and apart from the gate electrode. The high impurity drain layer has an impurity concentration higher than the impurity concentration of the low impurity drain layer. The method also includes forming a buried layer of the first conductivity type in a region deeper than the high impurity drain layer so that the buried layer forms a PN junction with the high impurity drain layer.

The invention also provides a manufacturing method of a semiconductor device. The method includes providing a semiconductor substrate of a first conductivity type, forming a low impurity drain layer of a second conductivity type in the surface of the semiconductor substrate, forming a field oxide film on the low impurity drain layer, forming a gate insulation film on the semiconductor substrate, forming a gate electrode on the gate insulation film so as to extend to a portion of the field oxide film, and forming a high impurity drain layer of the second conductivity type so as to be adjacent the low impurity drain layer and apart from the gate electrode. The high impurity drain layer has an impurity concentration higher than the impurity concentration of the low impurity drain layer. The method also includes forming a buried layer of the first conductivity type in a region deeper than the high impurity drain layer so that the buried layer forms a PN junction with the high impurity drain layer.

The invention further provides a manufacturing method of a semiconductor device. The method includes providing a semiconductor substrate of a first conductivity type, forming a low impurity drain layer of the second conductivity type in a surface of the semiconductor substrate, forming a first high impurity drain layer of the second conductivity type in a region adjacent the drain low impurity layer, forming a gate insulation film on the semiconductor substrate, and forming a gate electrode on the gate insulation film. The method also includes forming a source layer of the second conductivity type in the surface of the semiconductor substrate and a second high impurity drain layer of the second conductivity type in the first high impurity drain layer in a same ion implantation process. The depth of the source layer is smaller than the depth of the first high impurity drain layer, and each of the first and second high impurity drain layers has an impurity concentration higher than an impurity concentration of the low impurity drain layer.

The invention also provides a manufacturing method of a semiconductor device. The method includes providing a semiconductor substrate of a first conductivity type, forming a low impurity drain layer of the second conductivity type in a surface of the semiconductor substrate, forming a first high impurity drain layer of the second conductivity type in a region adjacent the low impurity drain layer, forming a buried layer of the first conductivity type in a region deeper than the first high impurity drain layer, forming a gate insulation film on the semiconductor substrate, and forming a gate electrode on the gate insulation film. The method also includes forming a source layer of the second conductivity type in the surface of the semiconductor substrate and a second high impurity drain layer of the second conductivity type in the first high impurity drain layer in a same ion implantation process. The depth of the source layer is smaller than the depth of the first high impurity drain layer, and each of the first and second high impurity drain layers has an impurity concentration higher than an impurity concentration of the low impurity drain layer.

The invention further provides a manufacturing method of a semiconductor device. The method includes providing a semiconductor substrate of a first conductivity type, forming a low impurity drain layer of a second conductivity type in the surface of the semiconductor substrate, forming a gate insulation film on the semiconductor substrate, forming a gate electrode on the gate insulation film, and forming a high impurity drain layer of the second conductivity type in the low impurity drain layer so that the high impurity layer is apart from the gate electrode. The high impurity drain layer has an impurity concentration higher than an impurity concentration of the low impurity drain layer. The method also includes forming a buried layer of the first conductivity type in a region deeper than the high impurity drain layer so that the buried layer forms a PN junction with the high impurity drain layer.

BRIEF DESCRIPTION OF THE DRAWINGS

FIG. 10A, FIG. 10B and FIG. 10C are cross-sectional views of device intermediates of the semiconductor device during its manufacturing following the steps of FIGS. 9A–9C.

DETAILED DESCRIPTION OF THE INVENTION

Figure 14:
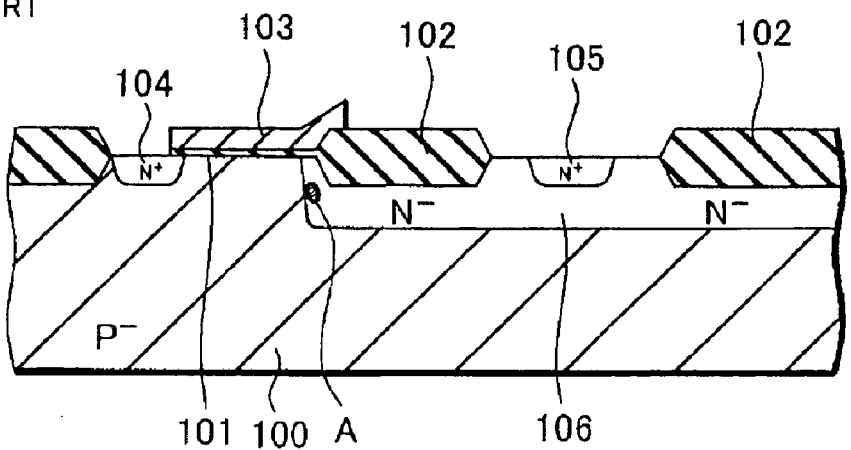
FIG. 14 is a cross-sectional view of a semiconductor device according to a conventional art.

After studying cases of the electrostatic discharge damage, the inventors found that a surge current converges in a region (region A in FIG. 14) in the N$^-$-type drain layer 106 under the gate electrode 103 and damages region A thermally. The following embodiments are directed to preventing the surge current convergence and thus the thermal breakdown of the device.

First, A manufacturing method of a semiconductor device according to the first embodiment of this invention as well as its device structure will be explained referring to FIGS. 1A–5.

Figure 1A:
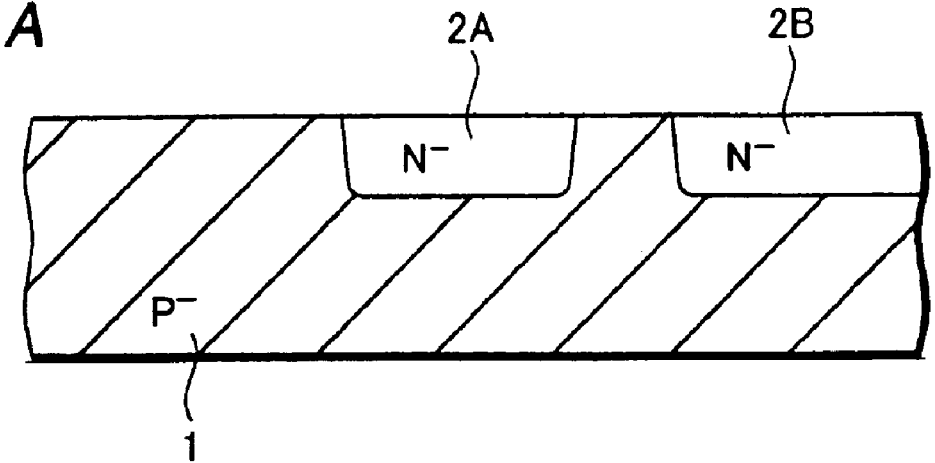
FIG. 1A, FIG. 1B and FIG. 1C are cross-sectional views of device intermediates of a semiconductor device during its manufacturing according to a first embodiment of this invention.

First, N$^-$-type drain layers 2A and 2B are formed in a surface of a P-type silicon substrate 1 by ion implantation and thermal diffusion, as shown in FIG. 1A. There is a clearance between the N$^-$-type drain layers 2A and 2B. No N$^-$-type drain layer is formed in the clearance because ions are prevented from being implanted in the clearance using a predetermined mask. Impurity concentration in the P-type silicon substrate 1 is $1\times10^{15}$/cm$^3$. In the ion implantation, phosphorus ions ($^{11}P^+$) of a dose of $1\times10^{13}$/cm$^2$, for example, are implanted into the P-type silicon substrate 1. The thermal diffusion is performed at 1100° C. in N$_2$ atmosphere, for example. As a result the N$^-$-type drain layers 2A and 2B are diffused about 1.2 μm deep.

Figure 1B:
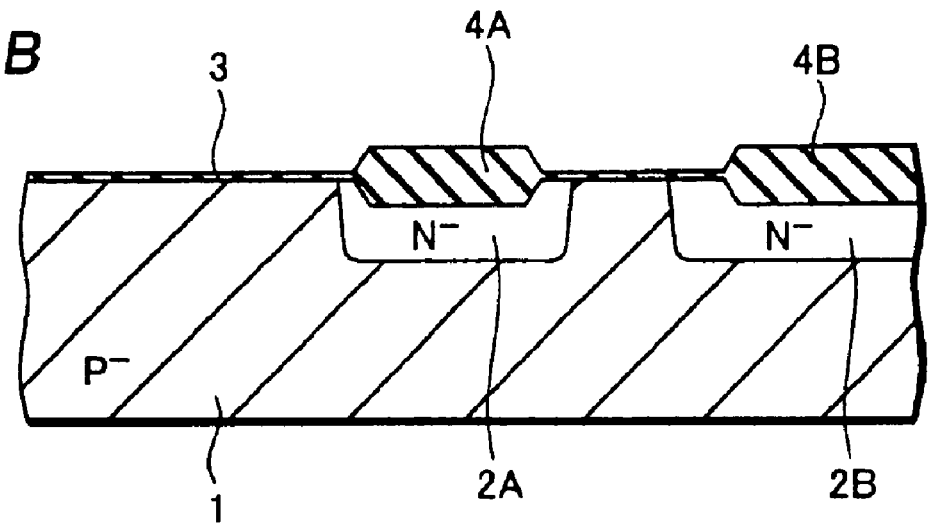

Next, as shown in FIG. 1B, thick field oxide films 4A and 4B are formed on the N$^-$-type drain layers 2A and 2B by LOCOS (Local Oxidation of Silicon) method. A field oxide film is formed for a purpose of element isolation in general. In the semiconductor device of this embodiment, however, the thick field oxide films 4A and 4B are utilized to enhance a withstand voltage of a high voltage transistor. Thickness of the thick filed oxide films varies from about 300 nm to about 600 nm, depending on the withstand voltage targeted. A gate oxide film 3 is formed on the surface of the silicon substrate 1 excluding the thick field oxide films 4A and 4B. Thickness of the gate oxide film 3 also varies from about 15 nm to about 100 nm, depending on the withstand voltage targeted. The thick field oxide films 4A and 4B are considerably thicker than the gate oxide film 3.

Figure 1C:
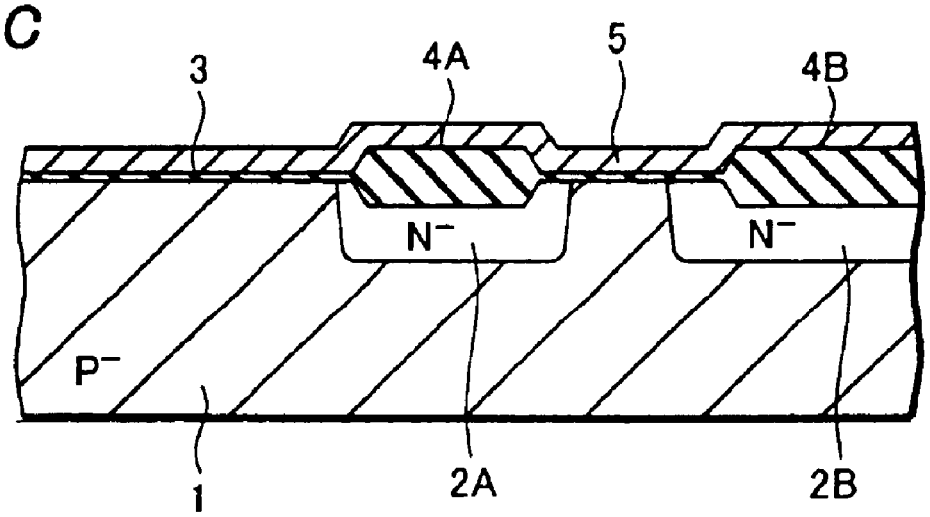

Next, as shown in FIG. 1C, a polysilicon layer 5 is deposited all over the surface by LPCVD method and an impurity such as phosphorus is diffused to reduce resistivity.

Figure 2A:
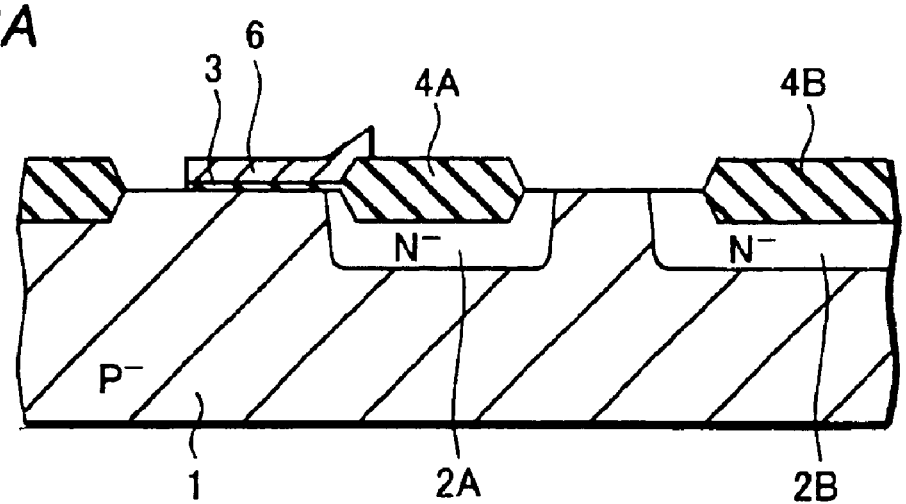
FIG. 2A, FIG. 2B and FIG. 2C are cross-sectional views of device intermediates of the semiconductor device during its manufacturing following the steps of FIGS. 1A–1C.

Next, the polysilicon layer 5 is selectively etched using a photoresist (not shown) to form a gate electrode 6, as shown in FIG. 2A. The gate electrode 6 is etched to cover the gate oxide film 3 and extend onto an adjacent portion of the field oxide film 4A.

Figure 2B:
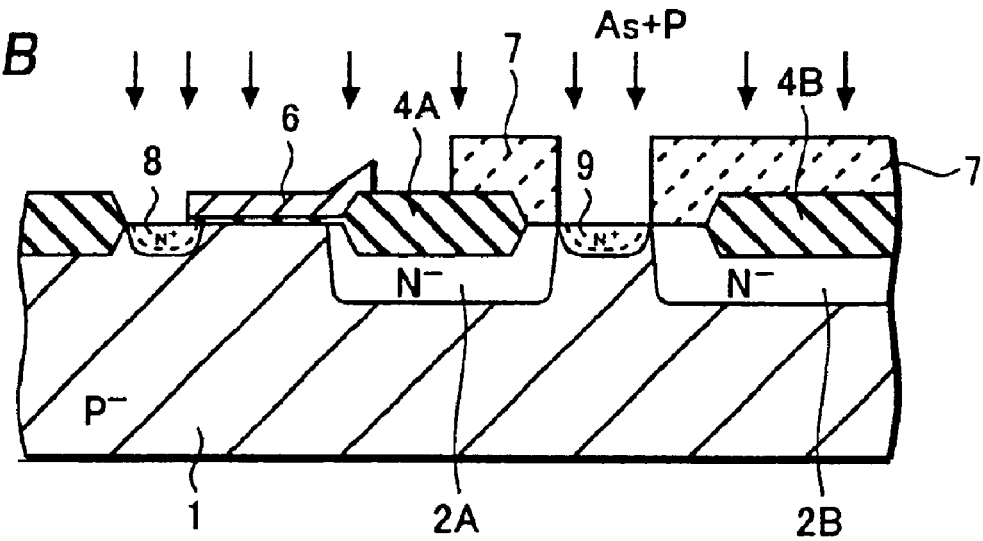

Next, an N$^+$-type source layer 8 and an N$^+$-type drain layer 9 are formed, as shown in FIG. 2B. In this process, a photoresist layer 7 having an opening between the N$^-$-type drain layers 2A and 2B is formed and ion implantation is made using the photoresist layer 7 as a mask. Arsenic ions ($^{75}As^+$) of a dose of $4\times10^{15}$/cm$^2$, for example, are implanted with acceleration energy of 40 KeV, and then phosphorus ions ($^{31}P^+$) of a dose of $4\times10^{15}$/cm$^2$ are implanted with acceleration energy of 40 KeV. That is, the N$^+$-type source layer 8 and the N$^+$-type drain layer 9 are formed with two kinds of N-type impurities, i.e., arsenic ($^{75}As^+$) and phosphorus ($^{31}P^+$). Since the phosphorus ($^{31}P^+$) is diffused deeper than the arsenic ($^{75}As^+$) by thermal treatment that follows, it contributes to enhancement of the source-drain withstand voltage.

Figure 2C:
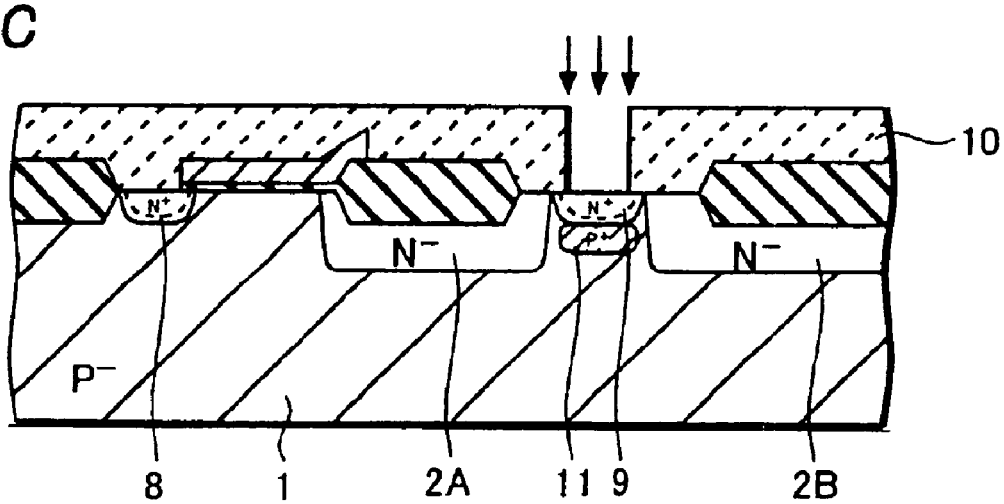

Next, after the photoresist layer 7 is removed, another photoresist layer 10 is formed by masked exposure and development, as shown in FIG. 2C. The photoresist layer 10 has a smaller opening than the photoresist layer 7. In other words, the photoresist layer 10 defines an ion implantation region inside the ion implantation region of the N$^+$-type drain layer 9. Then boron ions ($^{11}B^+$) of a dose of $4\times10^{12}$/cm$^2$ are implanted with acceleration energy of 160 KeV, for example, using the photoresist layer 10 as a mask.

A P$^+$-type buried layer 11 is, thus, formed in a region which is deeper than the N$^+$-type drain layer 9. Since the ion implantation region is formed as described above, the P+-type buried layer 11 is not in contact with the N−-type drain layer 2A or 2B. Thus impurity concentration in the P+-type buried layer 11 can be controlled with high precision unaffected by the impurity concentration in the N−-type drain layers 2A and 2B, making control of the ESD withstand voltage easier.

Figure 3A:
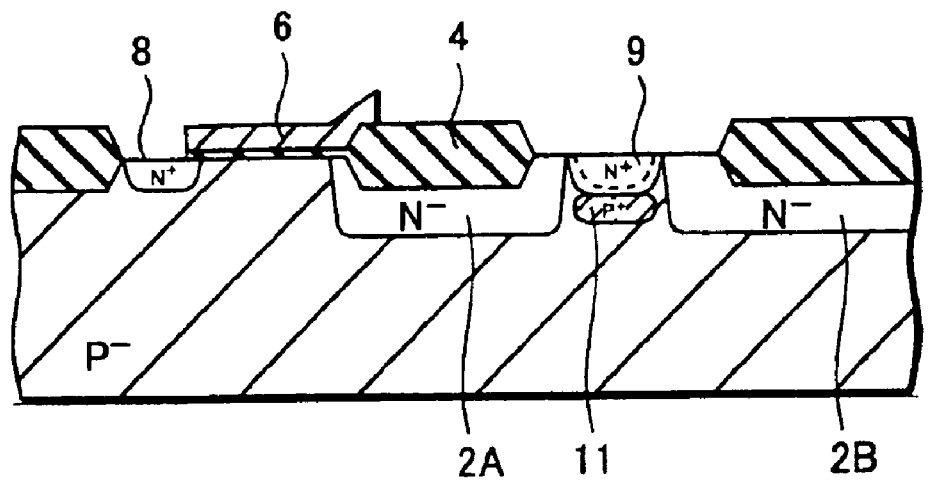
FIG. 3A and FIG. 3B are cross-sectional views of device intermediates of the semiconductor device during its manufacturing following the steps of FIGS. 2A–2C.

Next, as shown in FIG. 3A, the photoresist layer 10 is removed and the N+-type source layer 8 and the N+-type drain layer 9 are annealed at 800° C.

Figure 3B:
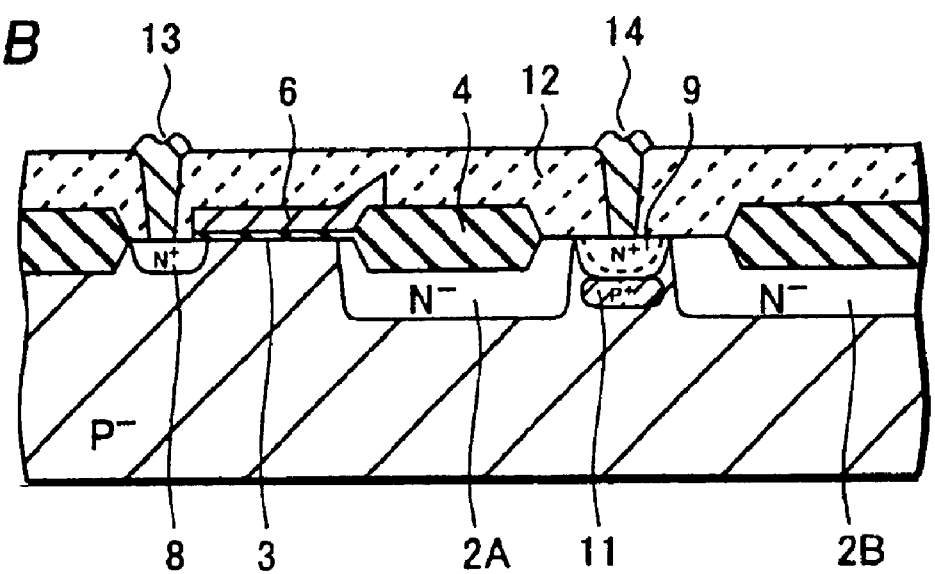

Then as shown in FIG. 3B, a BPSG (borophosphosilicate glass) film 12 is deposited as an interlayer insulation film by CVD method. After that, contact holes are formed on the N+-type source layer 8 and the N+-type drain layer 9, a source electrode 13 is formed on the N+-type source layer 8 and a drain electrode 14 is formed on the N+-type drain layer 9.

In the semiconductor device thus completed, the N−-type drain layer 2A, 2B is not formed under the N+-type drain layer 9, while the P+-type buried layer 11 is formed in the region under the N+-type drain layer 9. A PN junction of high impurity concentration is formed between the N+-type drain layer 9 and the P+-type buried layer 11. In other words, a region having low junction breakdown voltage is formed locally. The surge current flows through the PN junction into the silicon substrate 1 before the N−-type drain layer 2A below the gate electrode 6 is thermally damaged. Hence, the ESD withstand voltage is enhanced.

Figure 4:
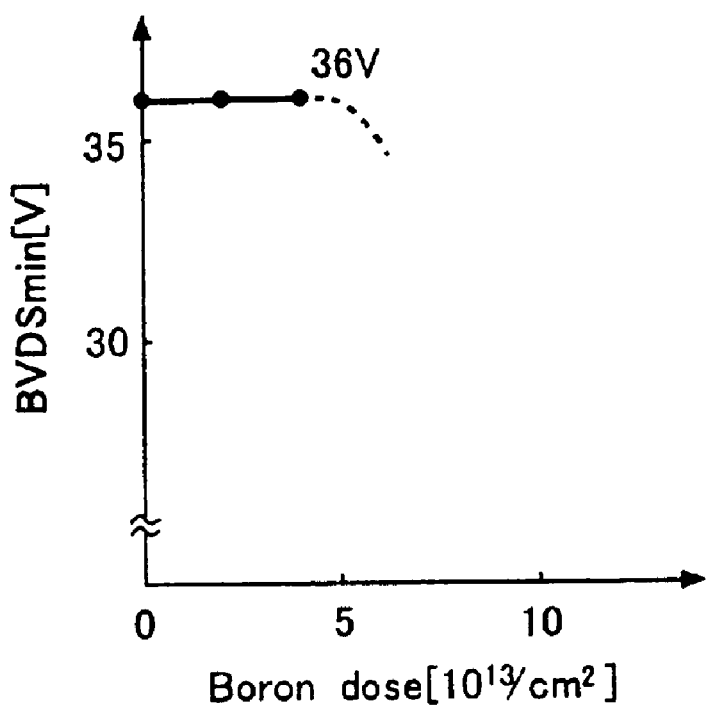
FIG. 4 shows a correlation between a minimum source-drain withstand voltage BVDSmin and a dose of boron ions ($^{11}B^+$) implanted to form a P$^+$-type buried layer 11.

FIG. 4 shows a correlation between the minimum source-drain withstand voltage BVDSmin and the dose of boron ions ($^{11}B^+$) implanted to form the P+-type buried layer 11 in the process described above. Here the minimum source-drain withstand voltage BVDSmin denotes the lowest source-drain withstand voltage including a case in which the transistor is in operation. Generally speaking, a source-drain withstand voltage of an N-channel type MOS transistor shows dependence on a gate voltage, and is minimized at certain gate voltage corresponding to a status in which a current flows between the source and the drain. As seen from FIG. 4, the minimum source-drain withstand voltage BVDSmin remains almost constant at 36V over a range of 0–4×10$^{12}$/cm$^2$ of the dose of boron ions ($^{11}B^+$).

Figure 5:
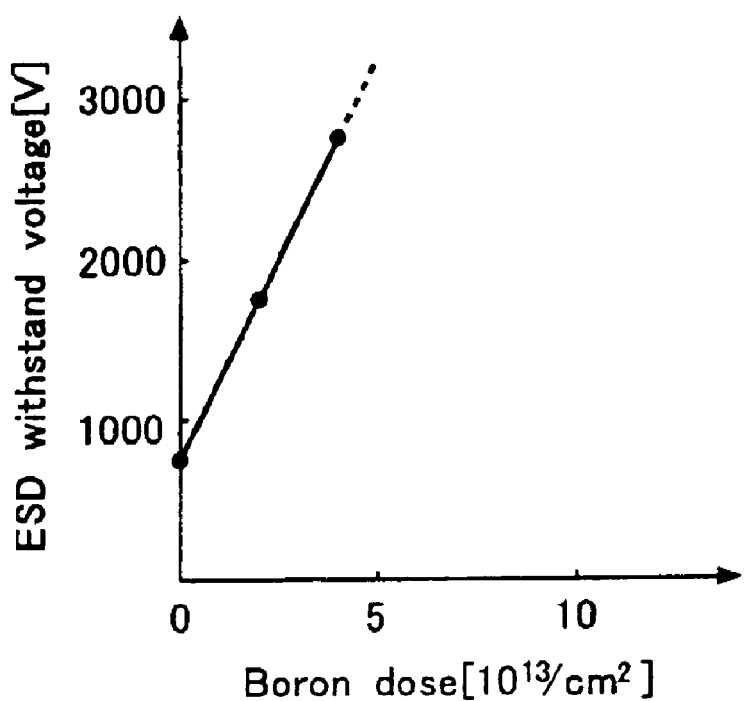
FIG. 5 shows a correlation between an ESD withstand voltage and the dose of boron ions ($^{11}B^+$) implanted to form the P$^+$-type buried layer 11.

FIG. 5 shows a correlation between the ESD withstand voltage and the dose of boron ions ($^{11}B^+$) implanted to form the P+-type buried layer 11. The ESD withstand voltage is 800V when the dose of boron ions ($^{11}B^+$) is 0. The ESD withstand voltage is improved even without the boron implantation, compared with the conventional art. It was confirmed experimentally that the ESD withstand voltage increased to 2700V when the dose of boron ions ($^{11}B^+$) is 4×10$^{12}$/cm$^2$, as shown in FIG. 5.

Next, a manufacturing method of a semiconductor device according to the second embodiment of this invention as well as its device structure will be explained referring to FIGS. 6A–8. Note that device components in common with the first embodiment shown in FIG. 1A–FIG. 3C are given the same symbols.

Figure 6A:
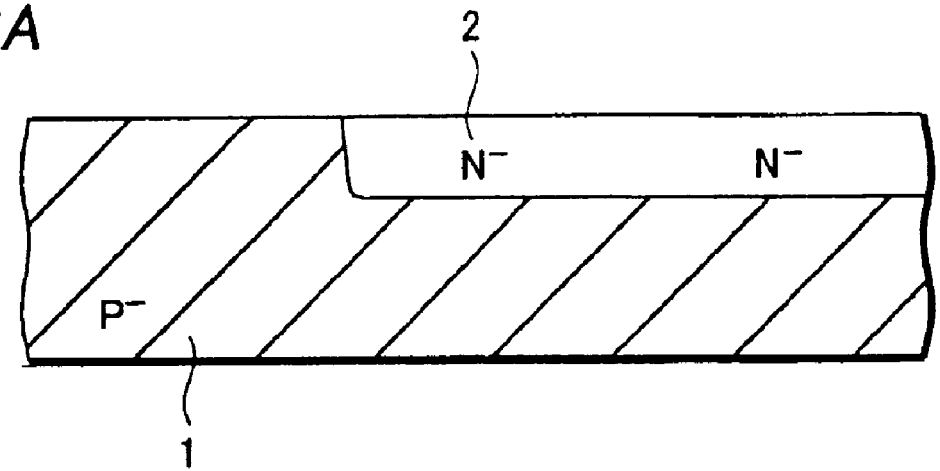
FIG. 6A, FIG. 6B and FIG. 6C are cross-sectional views of device intermediates of a semiconductor device during its manufacturing according to a second embodiment of this invention.

First, an N−-type drain layer 2 is formed in a surface of a P-type silicon substrate 1, as shown in FIG. 6A. What is different from the first embodiment is that there is no clearance in the N−-type drain layer 2. Other processing conditions are substantially the same as in the first embodiment.

Figure 6B:
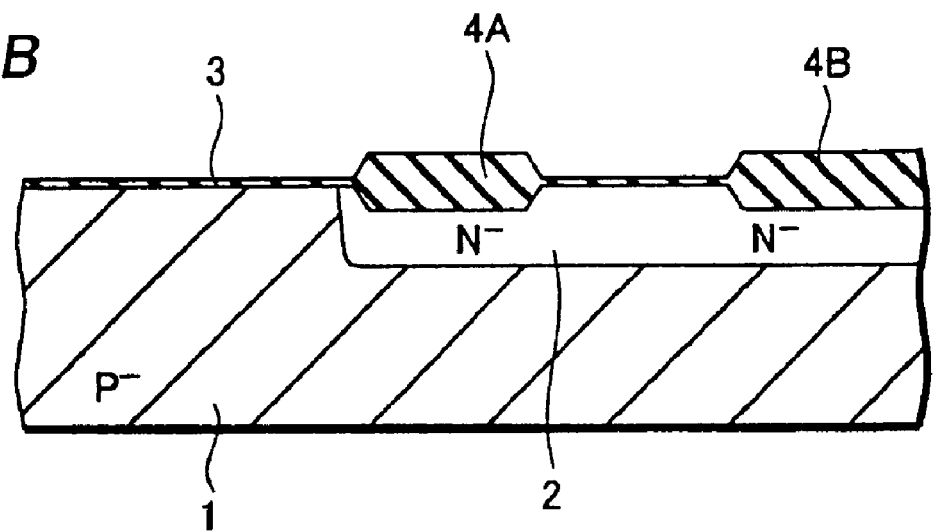
Figure 6C:
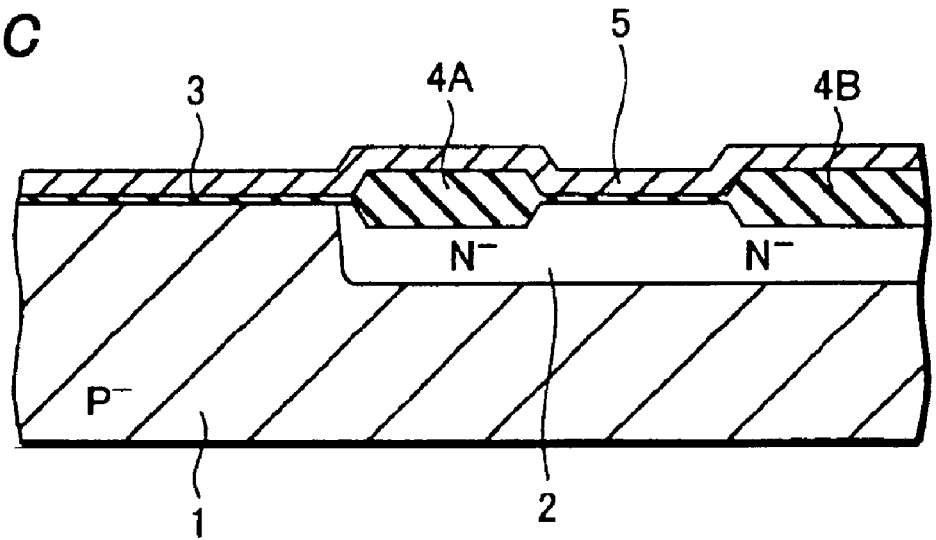

Next, a gate oxide film 3 and field oxide films 4A and 4B are formed as shown in FIG. 6B. Then a polysilicon layer 5 is formed all over the surface as shown in FIG. 6C.

Figure 7A:
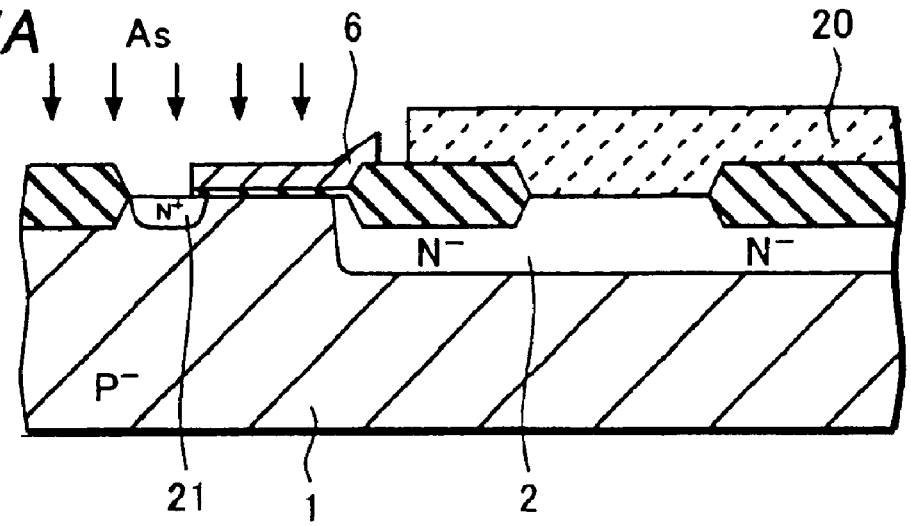
FIG. 7A, FIG. 7B and FIG. 7C are cross-sectional views of device intermediates of the semiconductor device during its manufacturing following the steps of FIGS. 6A–6C.

Next, as shown in FIG. 7A, a photoresist layer 20 is formed over the N−-type drain layer 2, and an N+-type source layer 21 is formed by implanting arsenic ions ($^{75}As^+$) of a dose of 4×10$^{15}$/cm$^2$ with acceleration energy of 40 KeV, for example.

Figure 7B:
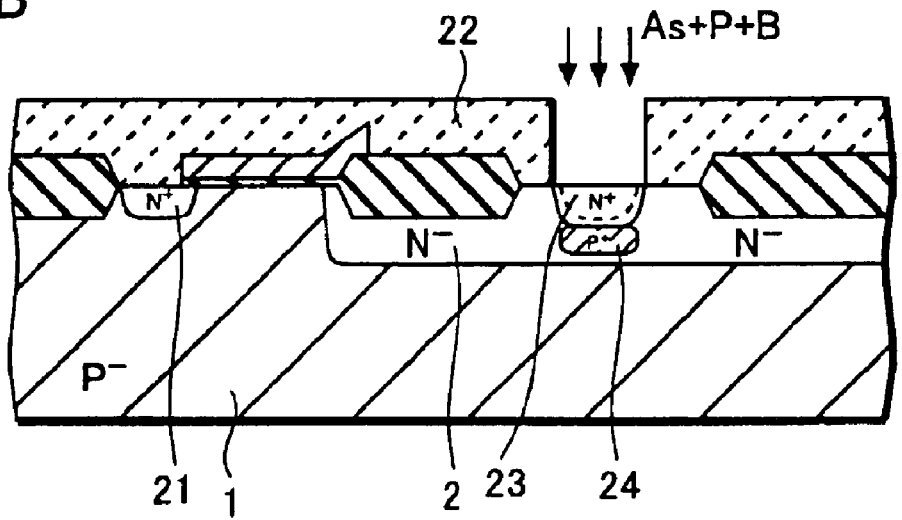

Next, after the photoresist 20 is removed, another photoresist layer 22 is formed, and an opening is formed in a region where an N+-type drain layer 23 is to be formed, as shown in FIG. 7B. And arsenic ions ($^{75}As^+$) of a dose of 4×10$^{15}$/cm$^2$ are implanted with acceleration energy of 40 KeV, and then phosphorus ions ($^{31}P^+$) of a dose of 4×10$^{15}$/cm$^2$ are implanted with acceleration energy of 40 KeV, for example. The N+-type drain layer 23 is formed with two kinds of N-type impurities, i.e., arsenic ($^{75}As^+$) and phosphorus ($^{31}P^+$). Since the phosphorus ($^{31}P^+$) is diffused deeper than the arsenic ($^{75}As^+$) by thermal treatment that follows, it contributes to enhancement of the source-drain withstand voltage.

A P+-type buried layer 24 is, then, formed in a region under the N+-type drain layer 23 by implanting boron ions ($^{11}B^+$) with acceleration energy of 160 KeV through the same opening in the photoresist layer 22.

Since the N−-type drain layer 2 is originally present under the N+-type drain layer 23 in this embodiment, increased dose of boron ions is required to make impurity concentration in the P+-type buried layer 24 equal to that in the first embodiment.

Figure 7C:
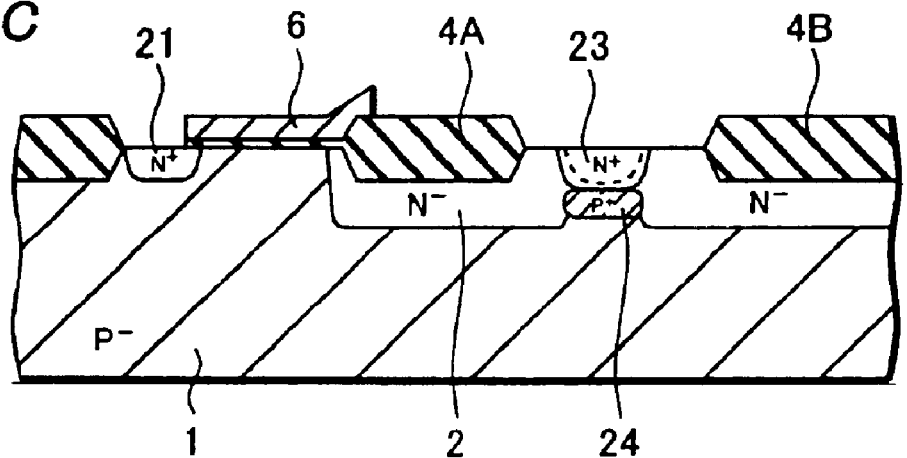

Next, as shown in FIG. 7C, the photoresist layer 22 is removed and annealing at 800° C., for example, is performed. Thus, the N+-type drain layer 23 and the P+-type buried layer 24 are diffused. For the surge current to flow rapidly into the silicon substrate 1, it is preferable that the P+-type buried layer 24 is diffused deep enough to contact the P-type silicon substrate 1.

Figure 8:
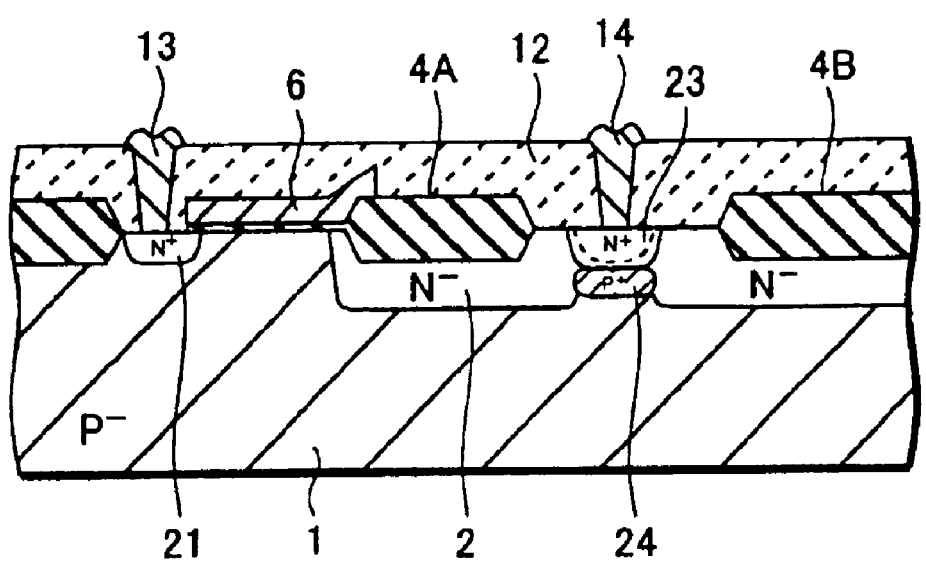
FIG. 8 is a cross-sectional view of a device intermediate of the semiconductor device during its manufacturing following the steps of FIGS. 7A–7C.

Then, a BPSG film 12 is deposited as an interlayer insulation film by CVD method, as shown in FIG. 8. Contact holes are formed on the N+-type source layer 21 and the N+-type drain layer 23, a source electrode 13 is formed on the N+-type source layer 21 and a drain electrode 14 is formed on the N+-type drain layer 23.

As described above, since the P+-type buried layer 24 is formed in the region under the N+-type drain layer 23, a PN junction of high impurity concentration is formed between the N+-type drain layer 23 and the P+-type buried layer 24, according to this embodiment. In other words, a region having low junction breakdown voltage is formed locally. The surge current flows through the PN junction into the silicon substrate 1 before the N−-type drain layer below the gate electrode is thermally damaged. As a result, it is expected that the ESD withstand voltage is enhanced as in the first embodiment.

Next, a manufacturing method of a semiconductor device according to the third embodiment of this invention as well as its device structure will be explained referring to FIGS. 9A–12.

Figure 9A:
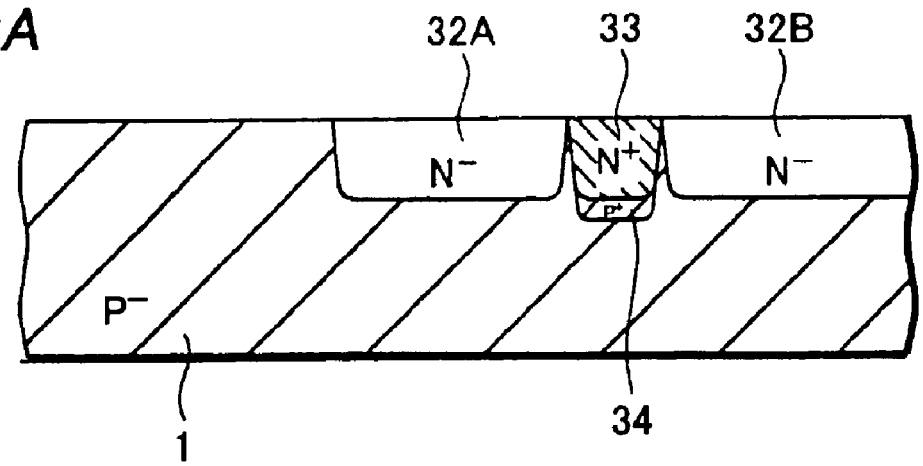
FIG. 9A, FIG. 9B and FIG. 9C are cross-sectional views of device intermediates of a semiconductor device during its manufacturing according to a third embodiment of this invention.

First, a P-type silicon substrate 1 (impurity concentration: about 1×10$^{15}$/cm$^3$) is provided, as shown in FIG. 9A. Then N−-type drain layers 32A and 32B are formed in a surface of the P-type silicon substrate 1. There is a clearance between the N−-type drain layers 32A and 32B. An N+-type second drain layer 33 is formed in the clearance. Also, a P+-type buried layer 34 is formed in a region under the second drain layer 33.

To form these layers, first, ions are implanted using a mask of photoresist to form the N−-type drain layers 32A and 32B. The ions are not implanted into the clearance so that no N⁻-type drain layer is formed there. In the ion implantation, phosphorus ions ($^{11}P^+$) of a dose of $2\times10^{13}/cm^2$, for example, are implanted into the P-type silicon substrate 1.

Next, boron ions ($^{11}B^+$) of a dose of $2\times10^{13}/cm^2$, for example, are implanted with acceleration energy of 160 KeV using a mask of photoresist to form the N⁺-type second drain layer 33 and the P⁺-type buried layer 34. Using the same mask of photoresist, arsenic ions ($^{75}As^+$) of a dose of $5\times10^{15}/cm^2-1\times10^{16}/cm^2$, for example, are implanted into the P-type silicon substrate 1 with acceleration energy of 40 KeV–50 KeV.

The ion implantations described above can be made in arbitrary order. However, it is preferable to make the order as described above because implanting arsenic ions ($^{75}As^+$) first and implanting boron ions ($^{11}B^+$) next would cause an explosion in the photoresist.

A structure shown in FIG. 9A is obtained when thermal diffusion is made after the ion implantations. The thermal diffusion is made at 1100° C. in $N_2$ atmosphere, for example. Not limited to the example shown in FIG. 9A in which the N⁺-type second drain layer 33 is diffused deeper than the N⁻-type drain layers 32A and 32B, the N⁺-type second drain layer 33 may be diffused shallower than the N⁻-type drain layers 32A and 32B. When all the layers are diffused simultaneously, the depths of the diffused layers can be controlled by the doses of the implanted ions. Or, the thermal diffusion of the N⁺-type second drain layer 33 can be made in a process different from the thermal diffusion of the N⁻-type drain layers 32A and 32B.

Figure 9B:
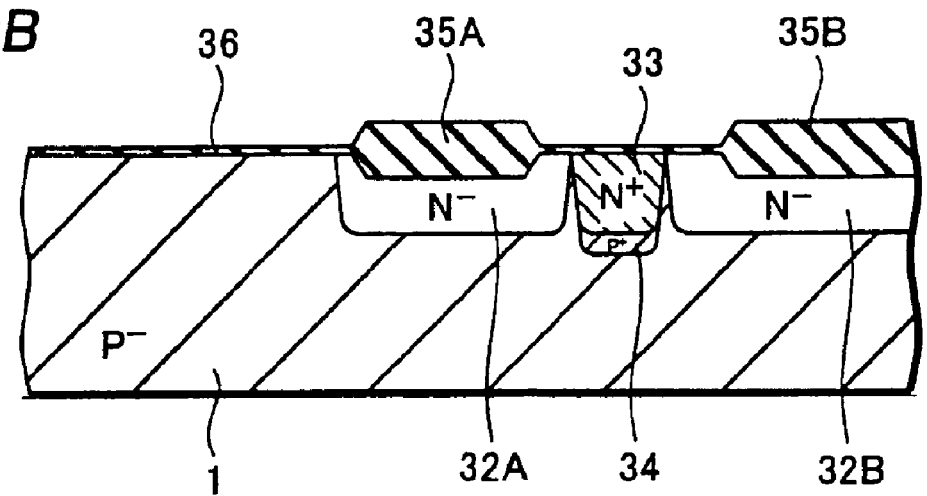

Next, as shown in FIG. 9B, thick field oxide films 35A and 35B are formed on the N⁻-type drain layers 32A and 32B by LOCOS method. Although a thick field oxide film is formed for isolation of elements in general, in this semiconductor device, however, the thick field oxide films 35A and 35B are utilized to improve the withstand voltage of the high voltage transistor. Thickness of the thick filed oxide films vary from about 300 nm to about 600 nm, depending on the withstand voltage targeted. A gate oxide film 36 is formed on the surface of the silicon substrate 1 excluding the thick field oxide films 35A and 35B. Thickness of the gate oxide film 36 also varies from about 15 nm to about 100 nm, depending on the withstand voltage targeted. The thick field oxide films 35A and 35B are considerably thicker than the gate oxide film 36.

Figure 9C:
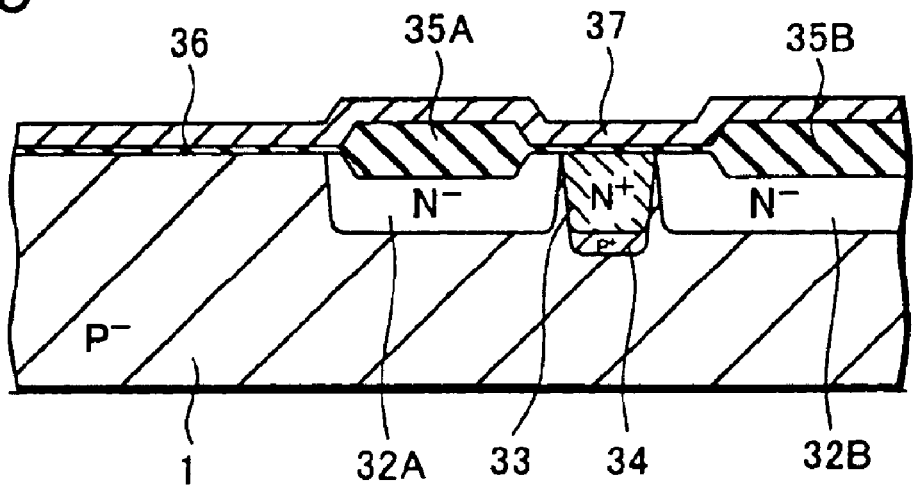

Next, as shown in FIG. 9C, a polysilicon layer 37 is deposited all over the surface by LPCVD method and an impurity such as phosphorus is diffused to reduce resistivity.

Next, the polysilicon layer 37 is selectively etched using a photoresist (not shown) to form a gate electrode 38, as shown in FIG. 10A. The gate electrode 38 is etched to cover the gate oxide film 36 and extend onto an adjacent portion of the field oxide film 35A.

Next, an N⁺-type source layer 40 and an N⁺-type first drain layer 41 are formed, as shown in FIG. 10B. In this process, a photoresist layer 39 having an opening over the N⁺-type second drain layer 33 is formed and ion implantation is made using the photoresist layer 39 as a mask. Arsenic ions ($^{75}As^+$) of a dose of $4\times10^{15}/cm^2$, for example, are implanted with acceleration energy of 40 KeV, and then phosphorus ions ($^{31}P^+$) of a dose of $4\times10^{15}/cm^2$ are implanted with acceleration energy of 40 KeV. A spacer oxide film may be formed on a sidewall of the gate electrode 38 before forming the photoresist layer 39, by depositing a CVD oxide film all over the surface and etching the CVD oxide film anisotropically. In this case, the above mentioned ion implantation may be made with a photoresist layer formed on the CVD oxide film left to have an opening over the N⁺-type second drain layer 33 using a mask.

The N⁺-type source layer 40 and the N⁺-type first drain layer 41 are formed with two kinds of N-type impurities, i.e., arsenic ($^{75}As^+$) and phosphorus ($^{31}P^+$). Since the phosphorus ($^{31}P^+$) is diffused deeper than the arsenic ($^{75}As^+$) by thermal treatment that follows, it contributes to enhancement of the source-drain withstand voltage. Next, the photoresist layer 39 is removed and the N⁺-type source layer 40 and the N⁺-type first drain layer 41 are annealed at 800° C.

Then, as shown in FIG. 10C, a BPSG film 42 is deposited as an interlayer insulation film by CVD method. Contact holes are formed on the N⁺-type source layer 40 and the N⁺-type first drain layer 41, a source electrode 43 is formed on the N⁺-type source layer 40, and a drain electrode 44 is formed on the N⁺-type first drain layer 41.

In the semiconductor device completed as described above, the N⁻-type drain layer 32A or 32B is not present under the N⁺-type first drain layer 41 and the deep N⁺-type second drain layer 33 is formed in a region under the N⁺-type first drain layer 41. The N⁺-type first drain layer 41 and the N⁺-type second drain layer 33 are combined together to make an N⁺-type layer deeper than the N⁺-type source layer 40 and having increased volume. Thus heat due to the surge current is dispersed in the N⁺-type layer, bolstering strength against the thermal damage due to the surge current.

Also, a P⁺-type buried layer 34 is formed in a region under the N⁺-type second drain layer 33. A PN junction of high impurity concentration is thus formed between the second drain layer 33 and the P⁺-type buried layer 34. In other words, a region having low junction breakdown voltage is formed locally. The surge current flows through the PN junction into the silicon substrate 1 before the N⁻-type drain layer 32A below the gate electrode 38 is thermally damaged. Hence, the ESD withstand voltage is enhanced.

Figure 11:
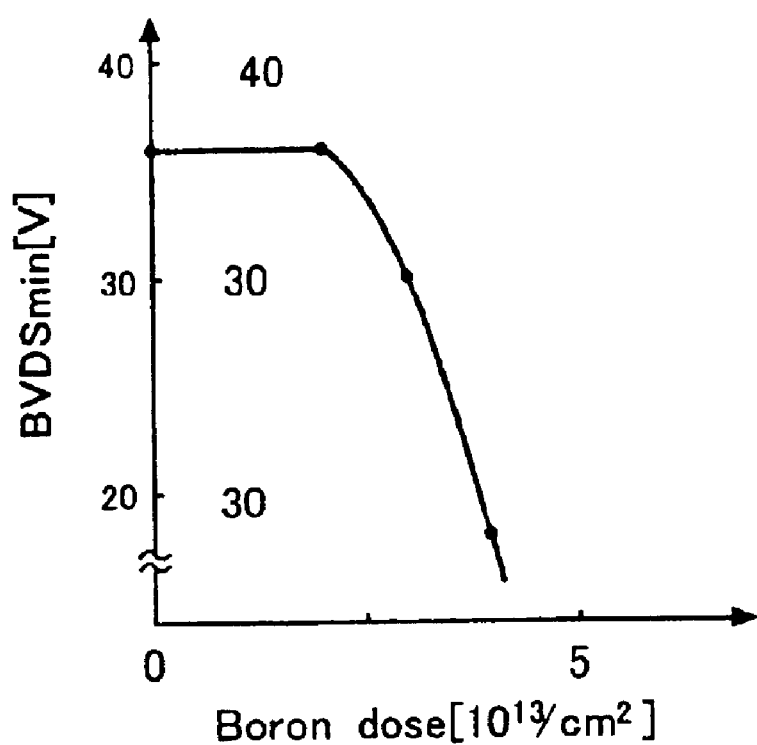
FIG. 11 shows a correlation between a minimum source-drain withstand voltage BVDSmin and a dose of boron ions ($^{11}B^+$) implanted to form a P$^+$-type buried layer 34.

FIG. 11 shows a correlation between the minimum source-drain withstand voltage BVDSmin and the dose of boron ions ($^{11}B^+$) implanted to form the P⁺-type buried layer 34 in the process described above. Here the minimum source-drain withstand voltage BVDSmin denotes the lowest source-drain withstand voltage including a case in which the transistor is in operation. Generally speaking, a source-drain withstand voltage of an N-channel type MOS transistor shows dependence on a gate voltage, and is minimized at certain gate voltage corresponding to a status in which a current flows between the source and the drain. As seen from FIG. 11, the minimum source-drain withstand voltage BVDSmin remains almost constant at 36V over the range of $0-2\times10^{13}/cm^2$ of the dose of boron ions ($^{11}B^+$). The minimum source-drain withstand voltage BVDSmin decreases for the dose of boron ions ($^{11}B^+$) beyond $3\times10^{13}/cm^2$.

Figure 12:
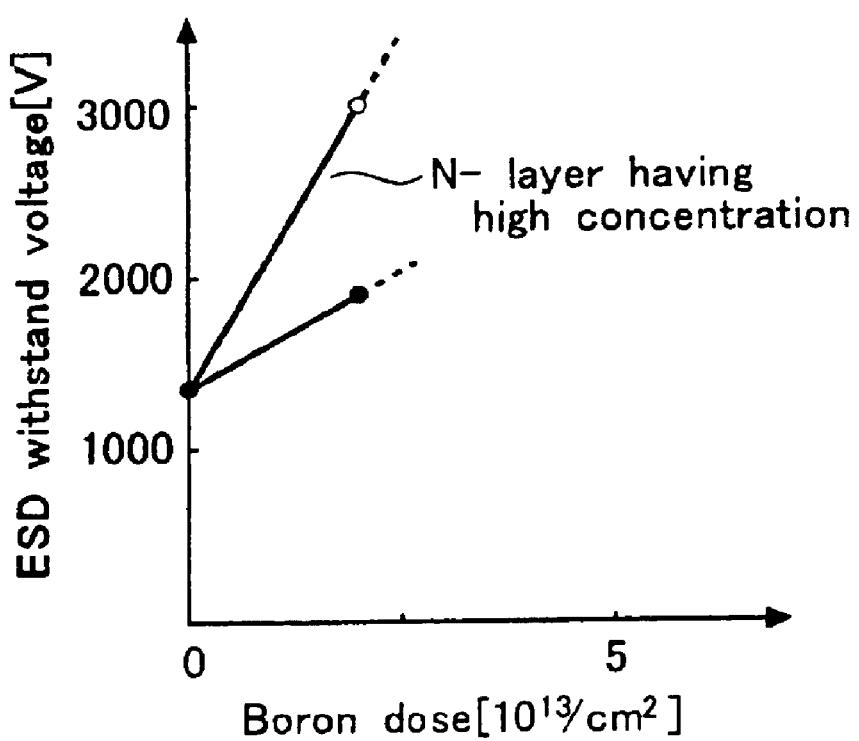
FIG. 12 shows a correlation between an ESD withstand voltage and the dose of boron ions ($^{11}B^+$) implanted to form the P$^+$-type buried layer 34.

FIG. 12 shows a correlation between the ESD withstand voltage and the dose of boron ions ($^{11}B^+$) implanted to form the P⁺-type buried layer 34. The ESD withstand voltage is 1300V when the dose of boron ions ($^{11}B^+$) is 0, that is, when there is no P⁺-type buried layer 34. Even so, the ESD withstand voltage is improved compared with the conventional art. The enhancement is attributed to providing the N⁺-type second drain layer 33. The ESD withstand voltage increases to 1800V when the dose of boron ions ($^{11}B^+$) is $2\times10^{13}/cm^2$. When the dose of implanted ions to form the N⁻-type drain layers 32A and 32B is increased to make the N⁻-type drain layers 32A and 32B of higher impurity concentration, the ESD withstand voltage is further enhanced to 3000V.

Figure 13:
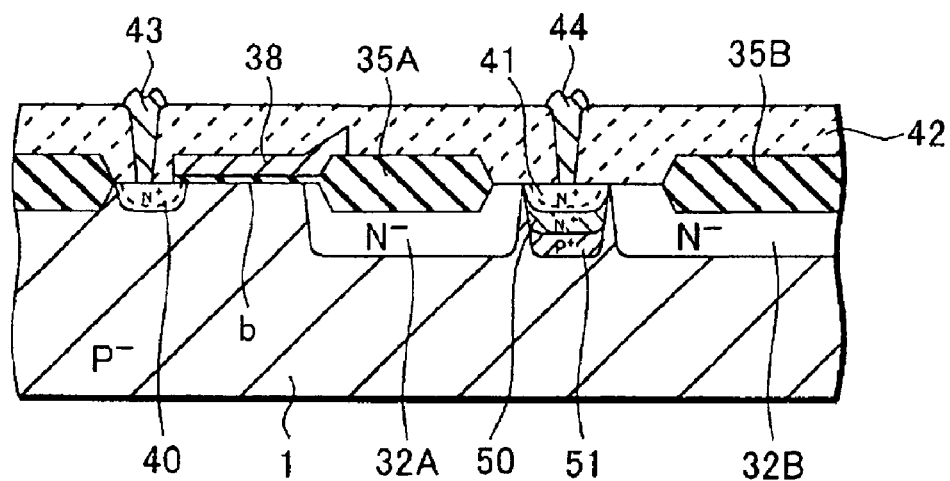
FIG. 13 is a cross-sectional view of a device intermediate of the semiconductor device during its manufacturing according to a fourth embodiment of this invention.

Next, a manufacturing method of a semiconductor device of the fourth embodiment of this invention will be explained referring to FIG. 13. This method is the same as the method of the third embodiment of this invention in the following aspects; not forming the N⁻-type drain layer 32A or 32B under the N⁺-type first drain layer 41, forming a deep N⁺-type second drain layer 50 in the region under the N⁺-type first drain layer 41 and forming a P⁺-type buried layer 51 in the region under the N⁺-type second drain layer 50. But the method of the fourth embodiment is different from the method of the third embodiment in that the diffusion depth of the N⁺-type second drain layer 50 is shallower than the diffusion depth of the N⁻-type drain layers 32A and 32B.

Although the total volume of combined N⁺-type layer, i.e., the N⁺-type first drain layer 41 and the N⁺-type second drain layer 50, is smaller in comparison to that of the third embodiment, it is expected that the ESD withstand voltage is improved, compared with the conventional art.

The same device design considerations are also applicable to P-channel type MOS transistors, although the explanation is made on the N-channel type MOS transistors in the embodiments described above.

In these embodiments, the N⁻-type drain layer 2 is not formed under the N⁺-type drain layer 9, instead the P⁺-type buried layer 11 is formed in the region under the N⁺-type drain layer 9. The ESD withstand voltage is thus improved. And the ESD withstand voltage can be enhanced at least to 2700V without sacrificing the minimum source-drain withstand voltage of the transistor by optimizing the dose of boron ions to form the P⁺-type buried layer 11.

Furthermore, the N⁻-type drain layer 32A or 32B is not formed under the N⁺-type first drain layer 41 and the deep N⁺-type second drain layer 33 is formed in a region under the N⁺-type first drain layer 41. The N⁺-type first drain layer 41 and the N⁺-type second drain layer 33 are combined together to make an N⁺-type layer deeper than the N⁺-type source layer 40 and having increased volume. Thus heat due to the surge current is dispersed in the N⁺-type layer, bolstering strength against the thermal damage due to the surge current. Because of this effect, the ESD withstand voltage was increased to 1300V even without forming the buried layer according to our experiment. When the P⁺-type buried layer 34 is formed in the region under the N⁺-type second drain layer 33 in addition to the structure described above, the ESD withstand voltage increased further to 3000V.

What is claimed is:

1. A manufacturing method of a semiconductor device, comprising:
    providing a semiconductor substrate of a first conductivity type;
    forming a low impurity drain layer of a second conductivity type in a surface of the semiconductor substrate;
    forming a low impurity drain layer of a second conductivity type in a surface of the semiconductor substrate;
    forming a gate insulation film on the semiconductor substrate;
    forming a gate electrode on the gate insulation film;
    forming a high impurity drain layer of the second conductivity type so as to be adjacent the low impurity drain layer and apart from the gate electrode, the high impurity drain layer having an impurity concentration higher than an impurity concentration of the low impurity drain layer; and
    forming a buried layer of the first conductivity type in a region deeper than the high impurity drain layer so that the buried layer forms a PN junction with the high impurity drain layer.

2. The manufacturing method of a semiconductor device of claim 1, wherein the buried layer is formed so as not to be in contact with the low impurity drain layer.

3. A manufacturing method of a semiconductor device, comprising:
    providing a semiconductor substrate of a first conductivity type;
    forming a low impurity drain layer of a second conductivity type in a surface of the semiconductor substrate;
    forming a field oxide film on the low impurity drain layer;
    forming a gate insulation film on the semiconductor substrate;
    forming a gate electrode on the gate insulation film so as to extend to a portion of the field oxide film;
    forming a high impurity drain layer of the second conductivity type so as to be adjacent the low impurity drain layer and apart from the gate electrode, the high impurity drain layer having an impurity concentration higher than an impurity concentration of the low impurity drain layer; and
    forming a buried layer of the first conductivity type in a region deeper than the high impurity drain layer so that the buried layer forms a PN junction with the high impurity drain layer.

4. The manufacturing method of a semiconductor device of claim 3, wherein the forming of the high impurity drain layer comprises a first ion implantation.

5. The manufacturing method of a semiconductor device of claim 4, wherein the forming of the buried layer further comprises a second ion implantation, and the second ion implantation is directed to a region that is inside a region to which the first ion implantation is directed.

6. A manufacturing method of a semiconductor device, comprising:
    providing a semiconductor substrate of a first conductivity type;
    forming a low impurity drain layer of a second conductivity type in a surface of the semiconductor substrate;
    forming a gate insulation film on the semiconductor substrate;
    forming a gate electrode on the gate insulation film;
    forming a high impurity drain layer of the second conductivity type in the low impurity drain layer so that the high impurity layer is apart from the gate electrode, the high impurity drain layer having an impurity concentration higher than an impurity concentration of the low impurity drain layer; and
    forming a buried layer of the first conductivity type in a region deeper than the high impurity drain layer so that the buried layer forms a PN junction with the high impurity drain layer.

* * * * *